United States Patent
Stasiak et al.

(10) Patent No.: US 7,638,252 B2
(45) Date of Patent: Dec. 29, 2009

(54) ELECTROPHOTOGRAPHIC PRINTING OF ELECTRONIC DEVICES

(75) Inventors: James William Stasiak, Lebanon, OR (US); Paul McClelland, Monmouth, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 545 days.

(21) Appl. No.: 11/045,921

(22) Filed: Jan. 28, 2005

(65) Prior Publication Data

US 2006/0172219 A1 Aug. 3, 2006

(51) Int. Cl.
*G03G 5/00* (2006.01)
(52) U.S. Cl. .................................. 430/120.2
(58) Field of Classification Search ............... 430/120.2
See application file for complete search history.

(56) References Cited

U.S. PATENT DOCUMENTS

| | | | |
|---|---|---|---|
| 3,565,713 A | 2/1971 | Van Wagner | |
| 4,092,161 A | 5/1978 | Radler, Jr. et al. | |
| 5,494,764 A | 2/1996 | Hyodo | |
| 5,576,135 A | 11/1996 | Nishikawa | |
| 6,080,606 A | 6/2000 | Gleskova et al. | |
| 6,171,740 B1 | 1/2001 | Fonash et al. | |
| 6,214,508 B1 | 4/2001 | Kamada et al. | |
| 6,294,401 B1 | 9/2001 | Jacobson et al. | |
| 6,309,901 B1 | 10/2001 | Tahon et al. | |
| 6,361,912 B2 | 3/2002 | Fonash et al. | |
| 6,740,538 B2 | 5/2004 | Miyadera | |
| 6,781,612 B1 | 8/2004 | Detig | |
| 6,815,218 B1 | 11/2004 | Jacobson et al. | |

2002/0005876 A1 1/2002 Grimes

FOREIGN PATENT DOCUMENTS

| JP | 2257696 | 10/1990 |
|---|---|---|
| WO | WO 00/21690 | 4/2000 |

OTHER PUBLICATIONS

Bakkers, Erik P.A.M., et al., "Synthesis of InP Nanotubes," J. Am. Chem. Soc. 2003, 125, 3440-3441.
Barry, Chad R., et al., "Printing nanoparticles from the liquid and gas phases using nanoxerography," Nanotechnology 14 (2003) 1057-1063.
Björk, M.T., et al., "One-dimensional heterostructures in semiconductor nanowhiskers," Applied Physics Letters, vol. 80, No. 6, (2002) 1058-1060.
Chan, X.F., et al., "ZnSe nanowires epitaxially grown on GaP(111) substrates by molecular-beam epitaxy," Applied Physics Letters vol. 83, No. 13 (2003) 2665-2667.
Chen, Jie, et al., "Vertical nanowire transistor in flexible polymer foil," Applied Physics Letters vol. 82, No. 26 (2003) 4782-4784.

(Continued)

*Primary Examiner*—Mark A Chapman

(57) ABSTRACT

A method of forming electrical devices can include electrophotographically printing a particulate material on a device substrate, and the particulate material can form at least a portion of the electrical device. An optional intermediate transfer member can also be used to improve reliability and performance of the process. Dry or liquid electrophotographic methods can be effectively used to form electronic devices on a wide variety of substrates not conventionally available in device fabrication.

28 Claims, 1 Drawing Sheet

OTHER PUBLICATIONS

Cui, Yi, et al., "Functional Nanoscale Electronic Devices Assembled Using Silicon Nanowire Building Blocks," Science vol. 291, (2001) 851-853.

Cui, Yi, et al., "High Performance Silicon Nanowire Field Effect Transistors," Nano Letters (2003) vol. 3, No. 2, 149-152.

Duan, Xiangfeng, et al., "Indium phosphide nanowires as building blocks for nanoscale electronic and optoelectronic devices," Nature vol. 409, No. 4, (2001) 66-69.

Duan, Xiangfeng, et al., "Single-nanowire electrically driven lasers," Nature, vol. 421 (2003) 241-245.

Elibol, O.H., et al., "Integrated nanoscale silicon sensors using top-down fabrication," Applied Physics Letters, vol. 83, No. 22, (2003) 4613-4615.

Englander, Ongi, et al., "Local synthesis of silicon nanowires and carbon nanotubes on microbridges," Applied Physics Letters, vol. 82, No. 26, (2003) 4797-4799.

Franceschi, S. De., et al., "Single-electron tunneling in InP nanowires," Submitted to Applied Physics Letters, Dated Feb. 25, 2003.

Greytak, Andrew B., et al., "Growth and transport properties of complementary germanium nanowire field-effect transistors," Applied Physics Letters, vol. 84, No. 21, (2004) 4176-4178.

Huang, Yu, et al., "Gallium Nitride Nanowire Nanodevices," Nano Letters (2002) vol. 2, No. 2, 101-104.

Huang, Yu, et al., "Logic Gates and Computation from Assembled Nanowire Building Blocks," Science vol. 294 (2001) 1313-1317.

Kamins, T.I., et al., "Growth and Structure of Chemically Vapor Deposited Ge Nanowires on Si Substrates," Nano Letters (2004) vol. 4, No. 3, 503-506.

Kawamura, Midori, et al., "Nanowires and Nanorings at the Atomic Level," Physical Review Letters, vol. 91, No. 9, (2003) 096102-1-095102-4.

Lauhon, Lincoln J., et al., "Epitaxial core-shell and core-multishell nanowire heterostructures," Nature, vol. 420, (2002) 57-61.

Liang, J., et al., "Nanoheteroepitaxy of GaN on a nanopore array Si surface," Applied Physics Letters vol. 83, No. 9, (2003) 1752-1754.

Liu, Z.Q., "Synthesis of silicon nanowires using AuPd nanoparticles catalyst of silicon substrate," Journal of Physics and Chemistry of Solids 61 (2000) 1171-1174.

Ma, D.D.D., et al., "Small-Diameter Silicon Nanowire Surfaces," Science vol. 299 (2003) 1874-1877.

Mao, Chuanbin, et al., "Virus-Based Toolkit for the Directed Synthesis of Magnetic and Semiconducting nanowires," Science (2004) vol. 303, 213-217.

Schubert, L., et al., "Silicon nanowhiskers grown on [111]Si substrates by molecular-beam epitaxy," Applied Physics Letters vol. 84, No. 24 (2004) 4968-4970.

Teys, S.A., et al., "Growth of Germanium Nanoislands and Nanowires on Singular and Vicinal Si(111) Surfaces Prior to the Formation of a Wetting Layer," Physics of the Solid State, vol. 46, No. 1 (2004) pp. 80-84.

"Tiny Transistors Scout for Cancer," Science 300 (2003) p. 242.

Whang, Dongmok, et al., "Large-Scale Hierarchical Organization of Nanowire Arrays for Integrated Nanosystems," Nano Letters 2003 vol. 3, No. 9, 1255-1259.

Whang, Dongmok, et al., "Nanolithography Using Hierarchically Assembled Nanowire Masks," Nano Letters, (2003) vol. 3, No. 7, 951-954.

Xia, Younan, et al., "One-Dimensional Nanostructures: Synthesis, Characterization, and Applications," Advanced Materials (2003) vol. 15, No. 5, 353-389.

Zervos, Matthew, et al., "Electronic structure of piezoelectric double-barrier InAs/InP/InAs/InP/InAs (111) nanowires," Journal of Applied Physics vol. 95, No. 1 (2004) 281-291.

Zhang, H.Z, et al., "Dependence of the silicon nanowire diameter on ambient pressure," Applied Physics Letters, vol. 73, No. 23, (1998) 3396-3398.

Crystal Structure and Optical Properties of Cd 32 S 14 (SC6H5) 36 #DMF4, a Cluster with a 15 Angstrom CdS Core; Science, vol. 259, pp. 1426-1428, Mar. 5, 1993; Herron et al.

ELECTROPHOTOGRAPHIC PRINTING OF ELECTRONIC DEVICES

FIELD OF THE INVENTION

The present invention relates generally to formation of electronic devices. More particularly, the present invention relates to processes and systems which use electrophotography to form electronic devices.

BACKGROUND OF THE INVENTION

Production of circuits and conductive traces has been accomplished in many different ways, each process having a range of benefits and drawbacks. Further, various methods for manufacturing printed circuit boards and electronic components are known. Typical methods for manufacturing printed circuits include print and etch, screen printing, and photoresist methods, e.g., applying photoresist, exposing, and developing. Frequently these methods involve considerable capital costs and restrictions on production times. Most device fabrication plants experience a constant struggle with high capital costs and limited ability to adjust process parameters and implement design changes. A number of methods have been explored to decrease costs associated with producing electronic components. Some of these methods include using various printing techniques to apply a conductive material, or a precursor thereof, to produce a useful electronic circuit. Yet many of these methods are often unreliable or otherwise undesirable for commercial scale production. In recent years, ink-jet technologies have been used to form circuitry. These ink-jet technologies include a variety of methods which have met with varying degrees of success.

Each of the above methods has disadvantages which limit their effectiveness, such as expense, reliability, and complexity. For this and other reasons, the need still exists for improved methods of forming conductive paths and electronic devices which have decreased manufacturing costs, allow for a wider variety of substrate materials, and which have improved electron mobility.

SUMMARY OF THE INVENTION

It has been recognized that it would be advantageous to develop improved methods and systems for forming electrical devices which entails reduced manufacturing costs and is conveniently applied to a wide variety of substrates. In accordance with one aspect of the present invention, a method of forming an electrical device can include electrophotographically printing a particulate material on a device substrate. The particulate material forms at least a portion of the electrical device. More specifically, suitable particulate materials can have an aspect ratio of at least about 2:1.

In another aspect of the present invention, a system for forming an electrical device can include an electrophotographic system having a photoreceptor drum and a radiant energy source which can selectively expose portions of the photoreceptor drum to form an electrostatic latent image. A particulate material applicator can be operatively associated with the photoreceptor drum and containing a particulate material which can be adhered to the electrostatic latent image. The system can optionally include an intermediate transfer member operatively associated with the photoreceptor drum and configured for receiving particulate material applied to the photoreceptor drum.

Additional features and advantages of the invention will be apparent from the following detailed description, which illustrates, by way of example, features of the invention.

BRIEF DESCRIPTION OF THE DRAWINGS

Aspects of the invention can be better understood with reference to the following drawings. The components in the drawings are not necessarily to scale, with emphasis instead being placed upon clearly illustrating the principles of the present invention.

DETAILED DESCRIPTION OF THE PREFERRED EMBODIMENT(S)

Figure 1:
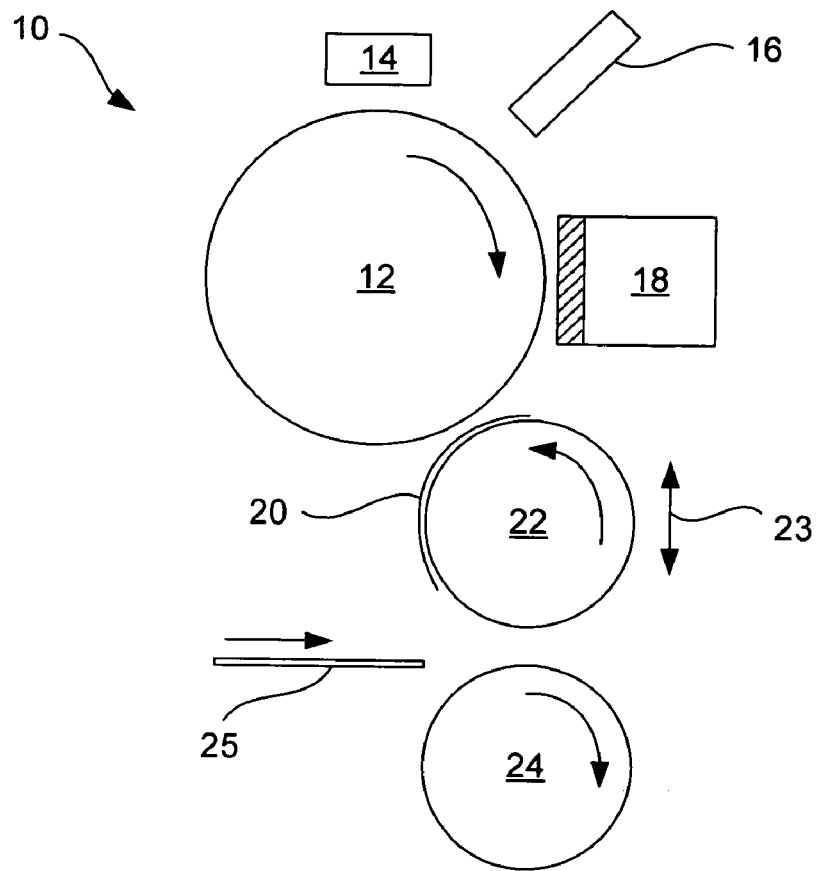
FIG. 1 illustrates a schematic view of an electrophotographic system according to one embodiment of the present invention.

Reference will now be made to exemplary embodiments and specific language will be used herein to describe the same. It will nevertheless be understood that no limitation of the scope of the invention is thereby intended. Alterations and further modifications of the inventive features described herein, and additional applications of the principles of the invention as described herein, which would occur to one skilled in the relevant art and having possession of this disclosure, are to be considered within the scope of the invention. Further, before particular embodiments of the present invention are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

In describing and claiming the present invention, the following terminology will be used.

The singular forms "a," "an," and "the" include plural referents unless the context clearly dictates otherwise. Thus, for example, reference to "a patterned particulate layer" includes reference to one or more of such layers.

As used herein, "aspect ratio" refers to the ratio of the longest dimension to the shortest dimension of a particle. Therefore, an increase in aspect ratio would indicate that the longest dimension has increased over the shortest dimension. For example, a nanowire having a 30 μm length and a diameter of about 10 nm has an aspect ratio of 3000:1. Further, an aspect ratio of 100:1 would be considered greater than an aspect ratio of 10:1. The dimensions are measured along edges or across a major axis to provide measurement of dimensions such as length, width, depth, and diameter. Thus, diagonal corner-to-corner measurements of dimension are not considered in the calculation of the aspect ratio.

As used herein, "electrophotographic" processes refer to dry or liquid electrophotography processes used in creating an electrostatic latent image, then transferring particles to the latent image, and transferring the particles to a substrate. Thus, electrophotography is intended to include dry processes involving small particulates, as well as liquid processes where particulates are suspended in a liquid carrier and the process involves electrophoretic mechanisms for transferring the particles to a latent image, and then to a substrate.

As used herein, "electronic device" refers to any device or feature which can be used in a commercial product that uses electrical current to achieve a designed function. Generally, electronic devices can include TFTs, MESFETs, MOSFETs, transistors, p-n junctions, circuits, memory, battery cells, solar cells, light emitting diodes, CPUs, sensor arrays, or any other electronic feature, as well as mechanical structures such as MEMs and nanoMEMs (NEMs) which operate or respond to an electrical current. Thus, the term electronic device is intended to include electrical and/or mechanical structures that can be incorporated as part of a larger device which uses electrical inputs to perform a particular designed function.

As used herein, "nano" is a prefix which refers to any particle or structure in which at least one dimension is in the nanometer range. Typically, the nanometer range can be from about 0.1 nm to about 100 nm. A wide variety of nanomaterials can be used and are known to those skilled in the art.

As used herein, "stabilizing agent" refers to a material which inhibits agglomeration or increases solubility of particulate materials in a liquid carrier. Stabilizing agents can include chemically attached functional groups or ligands to form a coating around individual particles, or can include a coating which physically surrounds individual particles.

As used herein, "pattern" and "patterned" refers to a collection of particles which are arranged in a desired position on a substrate. Patterns can range from conductive paths, circuits, individual patterns to form a feature or portion thereof, or any other desired arrangement. Patterns can vary in thicknesses and dimensions, depending on the desired device to be fabricated.

As used herein, "conductive path" refers to any mass of material which exhibits electrically conductive properties. The mass of material can be particles which are in physical contact, sintered particles, or a partially or fully crystallized mass or film. Further, "conductive" is intended to encompass conductive, semi-conductive, and the like as distinguished from insulating materials. The conductive path can be an electronic trace or circuit or can be a conductive pattern, e.g., decorational or informational pattern.

As used herein, "liquid carrier" is defined to include liquid compositions that can be used to carry particulate material, a stabilizing agent, and/or other optional components to a substrate in liquid electrophotographic embodiments. Liquid carriers are well known in the art, and a wide variety of liquid carriers can be used in accordance with embodiments of the present invention. Such liquid carriers can include a mixture of a variety of different agents, including without limitation, solvents, co-solvents, buffers, biocides, and water. Though a variety of agents can be used, the liquid carrier, in some embodiments, can be simply a single liquid component, such as water.

As used herein, "consolidating" includes any process which is capable of decreasing porosity and/or improving the electrical and mechanical integrity of the material. Typical consolidation processes can include annealing, sintering, cold or hot isostatic pressing, and other similar processes.

As used herein, "all-additive" refers to a process in which materials are arranged and formed into electronic components without subsequent material removal steps. This is in contrast to typical semiconductor fabrication methods which entail deposition of material followed by selective removal of portions of the material using photolithographic or other mask-type techniques. Thus, all-additive processes result in reduced waste material and fewer processing steps.

Concentrations, dimensions, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a range of about 1 to about 500 should be interpreted to include not only the explicitly recited limits of 1 and about 500, but also to include individual values such as 2, 3, 4, and sub-ranges such as about 10 to 50, about 20 to 100, etc.

In accordance with the present invention, a method of forming an electrical device can include the step of electrophotographically printing a particulate material on a device substrate. The particulate material can be printed in a pattern chosen to form at least a portion of an electrical device. Electrophotographic printing processes can be accomplished using a wide variety of processes and equipment.

Generally, particulate materials of the present invention can be particulates such as those which are substantially spherical or can have anisometric dimensions. Of particular interest in one embodiment of the present invention are particulate materials having an aspect ratio of at least about 2:1, and often from about 3:1 to about 5000:1. In some cases, the particulate materials can have an aspect ratio from about 5:1 or greater such as about 10:1 to about 1000:1. In one specific embodiment, aspect ratios from about 10:1 to about 100:1 can be used to provide good surface contact among particles, while also easing electrophotographic printing of the particles, e.g., due to difficulties in manipulating and reliably printing larger particles and maintaining a stable dispersion in the case of liquid electrophotography. These particulate materials can be nanoparticles or can be micron-particles. Further, particles having an aspect ratio greater than about 2:1 can provide decreased porosity and increased device performance over substantially spherical particles. This increased performance can be more pronounced in embodiments where the particulates are not fully melted, but rather are merely consolidated or sintered such that porosity and a portion of the particulate dimensions are preserved in the final device.

One class of particularly suitable materials is nanoparticles. Nanoparticles are, for the most part, a relatively recent development and have a wide variety of unique properties. A number of nanoparticle properties offer particular advantages in the practice of the present invention. For example, most nanoparticles have anisometric properties, i.e. dimensions, thermal and electrical conductivity. Additionally, many nanoparticles also have sintering and/or melting temperatures which are substantially below that of the bulk material, i.e. melting point depression. This can allow for consolidation and formation of electrical devices on materials which are susceptible to degradation at higher temperatures. Thus, in one alternative aspect, the particulate materials can be anisotropic.

Methods of forming such nanostructures are well known to those skilled in the art, although future developments are likely to produce additional methods. An excellent survey of current methods of synthesizing nanostructures can be found in Y. Xia et al., *One-Dimensional Nanostructures: Synthesis, Characterization, and Applications*, Adv. Mater. 2003, 15, No. 5, 353-389.

Nanoparticulate material can be provided in a wide variety of shapes and sizes. For example, the particulate material can be acquired and/or formed as nanowires, nanotubes, nanodiscs, nanoribbons, nanoplates, or mixtures thereof. In one specific embodiment of the present invention, the particulate material can be nanowires or nanotubes. In another specific embodiment, the particulate material can be substantially spherical nanoparticles or nanodots. Substantially spherical nanoparticles are intended to refer to particles having an aspect ratio close to 1:1, i.e. about 0.5:1 to about 1.5:1.

In yet another aspect of the present invention, the particulate material can be larger than nanoparticles such as meso- or micron-size particles. These particles can have a smallest dimension which typically ranges from about 0.1 μm to about 1000 μm, and are typically from about 0.5 μm to about 500 μm.

Additionally, the particulate material of the present invention can be formed of a wide variety of materials. For purposes of the present invention, particulate materials which are semi-conductive, conductive, insulating, or are formed of other electrically useful materials can be used. Non-limiting examples of suitable doped and undoped semi-conducting materials which can be used in forming electronic devices include Group IV elements such as Si, amorphous Si, and Ge; elements and compounds formed from Groups II and VI such as ZnO, ZnS, ZnSe, ZnTe, CdS, CdSe, CdO, CdTe, MgS, MgSe, MgTe, CaS, CaSe, CaTe, SrS, SrSe, SrTe, BaS, BaSe, and BaTe; elements and compounds formed from Groups III and V such as GaAs, InGaAs, InP, InAs, GaSb, InSb, and GaP; and other materials such as $Cu_2S$, $FeSi_2$, carbon nanotubes including doped carbon nanostructures, and other organic semiconductors. Suitable conducting materials include, without limitation, copper, silver, gold, cobalt, platinum, palladium, iridium, rhodium, osmium, iron, nickel, aluminum, stainless steel, doped-polysilicon, and combinations or alloys thereof. Other suitable conducting materials include GaN, GaSe, ITO (indium tin oxide), SnO, SiC, and $Bi_2S_3$. Similarly, non-limiting examples of suitable insulating materials can include silicon-containing material such as silicon nitride, silicon dioxide and silicon oxy-nitride, fluorosilicate glass, glasses, diamond-like carbon (having a high degree of $sp^3$ bonding), polystyrene, polytetrafluoroethylene, fluorinated polyimides, parylene (poly-p-xylylene or a derivative of poly-p-xylylene), polyarylene ether, siloxanes, silsesquioxanes, aerogels, xerogels, polyimide, epoxy, polyurethane, polyester, cyanoacrylate, polynorbornenes, fluorinated polymers, and combinations thereof. Often the dielectric layer can comprise a material having a dielectric constant of greater than about 3 and often greater than about 15 and, in most cases, less than about 150. The specific composition of particulate materials can depend on the desired product characteristics and can be formed of inorganic and/or organic materials. In one embodiment, the particulate material can consist essentially of inorganic material or can be comprised of a majority of inorganic material.

Referring now to FIG. 1, a system for electrophotographically printing electronic devices is shown generally at 10. In this example of electrophotographic printing, an electrostatic latent image can be formed on a photoreceptor drum 12. The photoreceptor drum can be coated with a photosensitive, selectively chargeable material. Typical photosensitive materials can include, but are not limited to, organic photosensitive materials, ZnO, CdS, Se, selenium-containing materials, amorphous silicon (a-Si), acrylic polymers, and the like. Frequently, photoreceptor layers can include multi-layered composites of at least two distinct layers. For example, a charge generation layer and a charge transport layer. The charge generation layer typically can be a thin, e.g. less than 5000 Angstrom, dispersion of a photosensitive dye or pigment and an organic binder. Charge transport layers typically include a dispersion of at least one type of transport molecule mixed into a polymeric binder. Different photosensitive materials can offer various advantages over one another such as reliability, resolution, speed, cost, good performance under varied operating conditions and other factors, and can be selected by those skilled in the art.

The photoreceptor drum 12 can be charged over substantially the entire surface of the drum using a charging subsystem 14 such as a corona, scorotron, charge roller, or other similar system. As the drum rotates (clockwise in FIG. 1), the surface can pass under a radiant energy source 16 configured to selectively expose portions of the photoreceptor drum to form an electrostatic latent image. Radiant energy can include any energy which is capable of forming a latent image. Suitable radiant energy can depend on the particular photoreceptive material used on the surface of the photoreceptor drum. However, typical radiant energy sources can include visible light, ultraviolet light, infrared light, or the like. Laser light sources offer a high degree of resolution, compatible photoreceptor drums, fast image formation, and are relatively inexpensive.

The electrostatic latent image can correspond to a desired electronic device or portion thereof. Specifically, the electrostatic latent image can be contacted with a particulate material. A particulate material applicator 18 can be operatively associated with the photoreceptor drum 12. The particulate material applicator contains particulate material and is designed to allow the particulate material to electrostatically adhere to the electrostatic latent image. The resulting structure is a patterned particulate layer electrostatically adhered to the drum surface. As a general matter, smaller particulate materials can be more readily printed using liquid electrophotographic methods. In liquid embodiments, the particulate material can be suspended in a liquid carrier with an optional stabilizing agent.

Particulate materials of the present invention can include a variety of materials which are capable of being electrophotographically printed. Suitable particulate materials can be supplied without additional components, e.g., consist essentially of the material which is to form a portion of the electronic device. In this manner, the particulate material can be electrophotographically printed directly, without modification. Alternatively, suitable particulate materials can be modified or combined with other materials to improve transport of the particles to the drum and/or substrate. For example, particulate materials can be combined with carrier beads which provide an electrostatically active mass which can be readily manipulated and moved. Carrier beads are typically substantially larger particles and can be several times larger, e.g., 2 to 100 times, such that multiple particulates can be adhered to each carrier bead. For example, typical particles can range from about 0.5 μm to about 50 μm while carrier beads for this range of particle sizes can often range from about 50 μm to about 500 μm. Carrier beads are most often formed of metallic and/or magnetic materials. Suitable carrier beads can comprise materials such as, but not limited to, iron, steel, or the like. The electrically active particulate materials can be chosen and/or designed to adhere to the carrier beads to facilitate handling during development. In the final stages of the development process, electrostatic and/or mechanical forces at the surface of the photoreceptor drum strip the particulate materials from the carrier beads. Once stripped, the carrier beads can be returned to the particulate material applicator 18 and reused. In yet another alternative, particulate material and/or carrier beads can be modified or treated to increase or decrease electrostatic activity. This modification can include the addition of a charge control agent such as hydrocarbon resins, polymers, silicone, fluorine, or the like. In this case, sacrificial charge control materials which are readily removed can be desirable. For example, an additional step, such as heating, can be performed to remove the charge control agent so as not to compromise the electronic device functionality.

Thus, in one embodiment of the present invention a system for forming an electrical device can include a means for electrophotographically printing a particulate material on a device substrate. Suitable means for electrophotographically printing can include a photoreceptor drum, a light source configured to selectively expose portions of the photoreceptor drum to form an electrostatic latent image, and a particulate material applicator operatively associated with the photoreceptor drum and containing a particulate material.

The patterned particulate layer can then be transferred from the photoreceptor drum 12 to an intermediate transfer member 22. This step of transferring the patterned particulate layer can be accomplished directly to a device substrate or indirectly via an intermediate member as described. Specifically, the patterned particulate layer can be transferred to the intermediate transfer member to form a precursor device 20 on the intermediate transfer member. The presence of the intermediate transfer member offers a number of advantages over direct transfer. Specifically, the use of an intermediate transfer member allows for printing multi-layered devices on a device substrate using the same photoreceptor drum and equipment. In this way, the precursor device being formed can be passed between the photoreceptor drum and intermediate member multiple times to allow printing of multiple layers and/or different types of material in the same or subsequent layer.

Additionally, providing an intermediate transfer member provides a controlled surface for building an electronic device. Thus, the precursor device can be built up in reverse on the intermediate transfer member. The materials which are deposited last would be the materials that contact the device substrate upon transfer from the intermediate transfer member. The intermediate transfer member has known surface contours, properties, and characteristics. In contrast, typical device substrates will often vary in surface contours, dimensions, roughness, mechanical elongation, distortion, etc. from substrate to substrate during volume production runs. Further, during repeated passes to produce a multi-layered device, the substrate may deform or change surface properties such that registration and accuracy of printed features can be difficult to achieve. Thus, using an intermediate transfer member allows for improved repeatability and reproducibility from one device to the next, as well as improved accuracy for printing of multi-layered devices. The use of an intermediate transfer member also reduces these difficulties as the device substrate does not need to be introduced until after production of the precursor device having patterned particulate layers is complete.

Alternatively, a temporary device substrate can be introduced such that the patterned particulate layer or layers which form the precursor device are first transferred to the temporary substrate. Subsequently, the precursor device can be transferred to a device substrate and the temporary substrate is removed or left in place as desired. In another optional embodiment, the patterned particulate layer can be transferred directly to the substrate without the use of an intermediate transfer member.

In yet another alternative, the precursor device can be printed or built up directly on the photoreceptor drum and then transferred to the intermediate transfer member. Appropriate increase in electric field strength can be made to adjust for increased resistance from the photoreceptor surface to the particulate material applicator across the device as the device precursor is formed. This increase in electric field strength can help to maintain removal rates of carrier beads, if used, and to effectively transfer particles to the device precursor surface.

Once the patterned particulate layers have been transferred to the intermediate member 22 to form a precursor device 20, the device can be consolidated during a separate pass. During this pass, the patterned particulate layer can also be transferred from the intermediate member to a device substrate 25. In one embodiment, the intermediate transfer member having the precursor device formed on the surface thereof can be disengaged, and then returned, from the photoreceptor drum 12 toward an impression member 24, as shown by arrows 23. In this case, the device substrate can be introduced and directed between the intermediate member and the impression member such that the precursor device is transferred and secured to the device substrate. The impression member can be a heated roller or other device which consolidates the printed patterned particulate layers through heat and/or mechanical pressure to form a final electronic device. This impression member and consolidation step can be adjusted to prevent excessive consolidation and/or melting which can reduce the accuracy and edge acuity of printed features, especially in multi-layered printed devices.

The above printing processes can be repeated as many times as necessary to form a desired three-dimensional electrical device. Each layer can usually be of different pattern and/or material depending on the device, e.g., conductive, semi-conducting, insulating, etc., though this is not required. The above described steps of electrophotographically printing can be repeated to form a multi-layered electrical device in an all-additive process. Typically, in order to electrophotographically print multiple types of materials, at least one additional particulate material applicator can be operatively associated with the photoreceptor drum. For example, a first particulate material applicator can contain a conductive material, a second particulate material applicator could contain an insulating material, and a third particulate material applicator can contain a semi-conducting material such that a wide variety of electronic devices can be formed.

In a similar manner as described above, the additional materials can be printed by forming a second electrostatic latent image on the photoreceptor drum and then contacting the second electrostatic latent image with the second particulate material. The second particulate material can be printed on top of previously printed materials, or can be printed adjacent to printed materials. Thus, the second or subsequently printed particulate materials can be printed as part of the first patterned particulate layer or as separate layers as needed. This process can be repeated until all desired features of the electronic device are formed. In this way, a solid three-dimensional or multi-layered device structure can be formed. The device structure can then be transferred to a device substrate as described above.

In yet an additional alternative embodiment, each different particulate material can be printed using separate photoreceptor and particulate applicator assemblies which surround a common intermediate transfer member. Each photoreceptor assembly can optionally include separate charging subsystems and radiant energy sources. In such an embodiment, each separate photoreceptor drum can be designed to facilitate transfer of a specific particulate material associated with that drum surface. Thus, the photoreceptor surface coating and particulate materials can be chosen to improve adherence of particles, image transfer, and reliability. This configuration also allows for increased printing speeds. Additionally, each photoreceptor drum and particle applicator assembly can be independent such that dry, liquid (LEP), or combinations of both liquid and dry processes can be used in a single system.

Furthermore, the intermediate transfer member does not need to be a cylindrical member as shown in FIG. 1 and described above. For example, the intermediate transfer member can be a flexible sleeve or a substantially flat surface. Using these types of intermediate transfer member allows for a sequential alignment of multiple photoreceptor assemblies.

In this way, the number of photoreceptor drums is not limited to those that could be arranged around a cylindrical intermediate member.

Regardless of the configuration of the intermediate transfer member, the use of an intermediate member also facilitates electrophotographic printing of electronic device material on a wide variety of substrates. For example, material suitable for use in device substrate can include glass, polymer, ceramic, and combinations or composites thereof. Further, although the substrate 25 is shown as flat, it will be understood that flexible or rigid substrates such as polymer, glass, or the like can also be effectively used by merely arranging the components in the appropriate positions to allow for a straight path through the system. Additionally, the all-additive printing options of the present invention allow for production of electronic devices over relatively large areas and low cost. Thus, applications which would particularly benefit from this technology include, but are not limited to, large area TFT displays, RFID circuitry and coupons, solar panels, and other similar large area applications.

In some embodiments subsequent particulate materials can be comprised of different materials. The additional material can be of a different composition such that it can form either insulating or conductive portions of the final electrical device, depending on the particular device configuration. In yet an additional aspect, the subsequent particulate material can be particulate particles having an aspect ratio of less than about 2:1 or can have an aspect ratio of at least about 2:1. Further, the electrophotographic printing can be used to print materials which form packaging and or other components of a final commercial electronic device. In this manner, the output from this process can be a fully finished product which requires few or no additional steps to produce.

Alternatively, portions of the device can be formed using optional processes such as, but not limited to, lithography, chemical vapor deposition, decomposition of a metal salt, physical vapor deposition, sputtering, thermal evaporation, electron-beam evaporation, electroless deposition, electroplating, or the like. These processes may be desirable due to processing costs, increased resolution, inability or difficulty of a material to be electrophotographically printed, or other factors. Specific non-limiting examples of potential deposition processes which can be used include plasma-assisted and/or ion-assisted processes, hot filament CVD, rf-CVD, laser CVD (LCVD), metal-organic CVD (MOCVD), sputtering, thermal evaporation PVD, ionized metal PVD (IMPVD), electron beam PVD (EBPVD), reactive PVD, plasma enhanced CVD (PECVD), atomic layer deposition (ALD), or the like.

The processes of the present invention can be readily used in connection with state of the art substrate handling processes such as precision roll-to-roll (R2R) processes. In R2R manufacturing, a roll of a flexible substrate such as plastic or metal foil runs through a device using rollers to define its path and maintain proper tension and position. As the substrate passes through various process stages, materials can be deposited and patterns can be created. Electronic devices and components can be built up on the substrate to produce a fully-integrated device.

The methods described herein will typically result in a random distribution of particles such as nanowires which form the device. The random distribution helps to improve inter-particle contact and can be useful in forming highly conductive and reliable portions of the device. Further, the electrophotographic processes of the present invention allows for a data driven mechanism for determining the patterns printed. Thus, the patterned particulate layers can be formed using software rather than the complex and involved steps of exposing masks, templates, or the like.

The electrophotographic techniques of the present invention allow for ease of design changes and quick process turnaround times for implementing different device configurations to be printed. Additionally, many of the basic components for electrophotographic printing of the present invention are readily available and can be incorporated to take advantage of available equipment to increase print speeds and reliability. Current electrophotographic techniques which can be used in connection with the present invention allow for features having a smallest dimension of about 10 µm, and typically from about 50 µm. In addition, no electrodes are required for placement of particles. Similarly, the present invention does not involve electret materials or PDMS stamps to transfer charge.

The electrophotographic methods and systems of the present invention can be used to produce a wide variety of electronic devices. Although no particular limitation on the potential applications is intended, the present invention can be used to produce devices such as transistors, metal semiconductor field effect transistors (MESFETs), metal oxide field effect transistors (MOSFETs), junction field effect transistors (JFETs), radio frequency identification tags (RFIDs), memory, battery cells, solar cells, light emitting diodes (LEDs), CPUs, large area display panels (e.g. TFTs), sensor arrays, and the like.

Regardless of the specific device design, the methods and systems described herein can be useful in producing electrical devices which have at least one device layer for performing an electrical function. These device layers which form the device precursor can be formed in accordance with the electrophotographic steps described above. The resulting devices can have unique properties such as flexibility and high reliability. Further, the consolidated anisometric particulate materials tend to provide improved contact between particles which can improve reliability, service life, and maximum current. Typically, such devices can be then incorporated into a commercial product such as a multi-component device and then applying a voltage to the electrical device to achieve a designed functionality.

Figure 2:
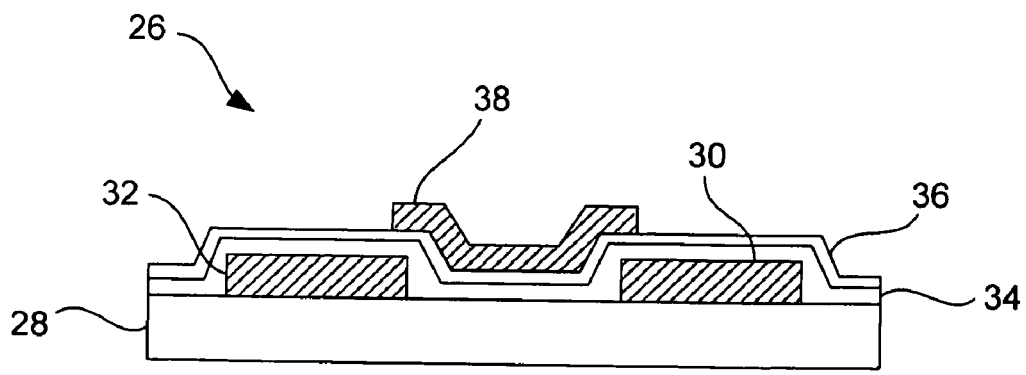
FIG. 2 illustrates a side cross-sectional view of an electronic device formed in accordance with an embodiment of the present invention.

Referring now to FIG. 2, one specific example of a thin film transistor (TFT) electronic device is shown generally at 26. Starting with an insulating substrate 28, source 30 and drain 32 features can be formed using either traditional deposition techniques or the electrophotographic techniques described above or a mixture of each method. The source and the drain can be formed as substantially parallel conductive traces having a space there between. Next, a semi-conducting layer 34 can be formed over the source and drain and connects the two features. The semi-conducting layer can be formed of an amorphous material (such as p- or n-type zinc oxide, amorphous silicon, or other oxide semiconductors), electrically active organic materials (such as pentacene), semi-conducting nanowires or carbon nanotubes, core shell nanowires or interconnected networks of nanoparticles or quantum dots. This semi-conducting layer provides the transistor channel for the TFT device. Subsequently, a gate insulator layer 36 can be deposited over the previous layers. The gate insulator layer can include organic, inorganic, or a mixture of organic and inorganic materials. Finally, a metallic gate electrode 38 is printed over the previous layers spanning the space between the source and drain device elements. Vias and/or other structures which contact the source and drain electrodes and are useful for incorporation of the device into a commercial product can be made at the same time as the source and drain, or later in the manufacturing process using conventional etching or laser processes. Although a staggered top-gate TFT is described above, it will be understood that any known device configuration can be formed using the methods and systems of the present invention. For example, planar structures, bottom-gate designs, or the like can be formed be printing the appropriate materials and patterns to achieve the desired device.

It is to be understood that the above-referenced arrangements are illustrative of the application for the principles of the present invention. Thus, while the present invention has been described above in connection with the exemplary embodiments of the invention, it will be apparent to those of ordinary skill in the art that numerous modifications and alternative arrangements can be made without departing from the principles and concepts of the invention as set forth in the claims.

What is claimed is:

1. A method of forming an electrical device, comprising the step of electrophotographically printing an electrically insulating particulate material on a device substrate, said electrically insulating particulate material forming at least a portion of the electrical device, and having an aspect ratio of at least about 10:1.

2. The method of claim 1, wherein the particulate material has an aspect ratio from about 11:1 to about 5000:1.

3. The method of claim 1, wherein the particulate material is selected from the group consisting of nanowires, nanotubes, nanodiscs, nanoribbons, nanoplates, and mixtures thereof.

4. The method of claim 1, wherein the particulate material comprises an electrically conductive material.

5. The method of claim 1, wherein the device substrate comprises a member selected from the group consisting of glass, polymer, ceramic, and combinations or composites thereof.

6. The method of claim 1, wherein the step of electrophotographically printing, comprises the steps of:
   a) forming a first electrostatic latent image on a photoreceptor drum;
   b) contacting the first electrostatic latent image with the particulate material such that at least a portion of the particulate material electrostatically adheres to the electrostatic latent image to form a first patterned particulate layer; and
   c) transferring the first patterned particulate layer to the device substrate.

7. The method of claim 6, wherein the step of transferring is accomplished using an intermediate transfer member.

8. The method of claim 7, further comprising electrostatically printing an additional particulate material as part of the first patterned particulate layer.

9. The method of claim 6, further comprising the step of consolidating the first patterned particulate layer subsequent to the step of transferring.

10. The method of claim 6, further comprising the steps of:
    a) forming a second electrostatic latent image on the photoreceptor drum;
    b) contacting the second electrostatic latent image with a second particulate material to form a second patterned particulate layer; and
    c) transferring the second patterned particulate layer to the first patterned particulate layer to form a multi-layered precursor device.

11. The method of claim 10, wherein the first and second particulate material are comprised of different materials.

12. The method of claim 6, wherein a plurality of particulate materials is electrostatically printed using a plurality of respective photoreceptor drums.

13. The method of claim 1, wherein the method is an all-additive process of forming the electrical device.

14. The method of claim 1, wherein the step of electrophotographically printing is a liquid electrophotography process.

15. A method of forming an electrical device, comprising the step of electrophotographically printing a particulate material on a device substrate, said particulate material forming at least a portion of the electrical device, and having an aspect ratio of at least about 10:1, wherein the step of electrophotographically printing, comprises the steps of:
    a) forming a first electrostatic latent image on a photoreceptor drum;
    b) contacting the first electrostatic latent image with the particulate material such that at least a portion of the particulate material electrostatically adheres to the electrostatic latent image to form a first patterned particulate layer; and
    c) transferring the first patterned particulate layer to the device substrate.

16. The method of claim 15, wherein the particulate material has an aspect ratio from about 11:1 to about 5000:1.

17. The method of claim 15, wherein the particulate material is selected from the group consisting of nanowires, nanotubes, nanodiscs, nanoribbons, nanoplates, and mixtures thereof.

18. The method of claim 15, wherein the particulate material comprises an electrically conductive material.

19. The method of claim 15, wherein the particulate material comprises an electrically insulating material.

20. The method of claim 15, wherein the device substrate comprises a member selected from the group consisting of glass, polymer, ceramic, and combinations or composites thereof.

21. The method of claim 15, wherein the step of transferring is accomplished using an intermediate transfer member.

22. The method of claim 21, further comprising electrostatically printing an additional particulate material as part of the first patterned particulate layer.

23. The method of claim 15, further comprising the step of consolidating the first patterned particulate layer subsequent to the step of transferring.

24. The method of claim 15, further comprising the steps of:
    a) forming a second electrostatic latent image on the photoreceptor drum;
    b) contacting the second electrostatic latent image with a second particulate material to form a second patterned particulate layer; and
    c) transferring the second patterned particulate layer to the first patterned particulate layer to form a multi-layered precursor device.

25. The method of claim 24, wherein the first and second particulate material are comprised of different materials.

26. The method of claim 15, wherein a plurality of particulate materials is electrostatically printed using a plurality of respective photoreceptor drums.

27. The method of claim 15, wherein the method is an all-additive process of forming the electrical device.

28. The method of claim 15, wherein the step of electrophotographically printing is a liquid electrophotography process.

* * * * *